TERMINAL

Filed Feb. 27, 1964

2 Sheets-Sheet 1

INVENTOR.
Frank A. Kukla,
BY
Hume, Groen, Clement & Hume
Attorneys.

INVENTOR.
Frank A. Kukla,
BY
Hume, Groen, Clement & Hume
Attorneys.

United States Patent Office 3,328,749
Patented June 27, 1967

3,328,749
TERMINAL

Frank A. Kukla, Cicero, Ill., assignor to Malco Manufacturing Company, Inc., Chicago, Ill., a corporation of Illinois Filed Feb. 27, 1964, Ser. No. 347,784
10 Claims. (Cl. 339—221)

The present invention is related in general to electrical terminals. It deals more particularly with improved terminals for inserting in a mounting board such as a printed circuit board or the like.

Printed circuit boards are now widely utilized in the radio and television industries, as well as in other electrical and electronic industries. The technology of establishing superior electrical connections between the various electrical components of a system and the circuitry of a printed circuit board or the like has become of prime importance. Such electrical connections are presently preferably made through wire wrap terminals or the like seated in apertures formed in the material of the printed circuit board.

Establishing suitable connections between the terminal pins and the circuitry of the board is a relatively complex and expensive proposition by presently known techniques. For example, it has been considered necessary to use a polygonal shaped aperture in the printed circuit board and a polygonal cross sectioned pin staked or wedge-fitted into the aperture to assure that the pin is locked against rotational displacement; a factor of particular significance during a wire wrap operation, for example.

Accordingly, it is an object of the present invention to provide an improved terminal for inserting in a mounting board such as a printed circuit board or the like.

It is another object to provide a terminal incorporating a new and improved locking arrangement for solidly seating and securely locking the terminal pin in an aperture formed in a terminal board.

It is still another object to provide locking arrangement for solidly seating and securely locking the terminal pin in an aperture formed in a terminal board.

It is still another object to provide a locking arrangement which locks the terminal pin securely against displacement axially, laterally, and rotationally in a printed circuit board, for example.

It is yet another object to provide a locking arrangement for a terminal pin which cooperates with the softer material of a printed circuit board, for example, to seat the terminal solidly and lock it securely in the board.

It is a further object to provide a new and improved locking arrangement for seating a flat sheet metal terminal pin securely in a circular aperture formed in the terminal board, thus obviating the necessity of properly orientating a terminal board to receive the terminal pins.

It is still a further object to provide a locking arrangement for seating a terminal pin in a printed circuit board or the like which takes advantage of slight resiliency in the material forming the board to provide a locking effect.

The foregoing and other objects are realized in accord with the present invention by providing an improved terminal pin including a new and improved locking arrangement for solidly seating and securely locking the terminal pin in a circular aperture in the relatively softer material of a printed circuit board or the like. The invention resides in forming tapered locking barbs on the locking shank of the pin. The locking barbs are formed from the material of the pin itself and protrude outwardly of the locking shank which might take any form in cross section, though it is preferably square or rectangular. The normal cross sectional dimensions of the locking shank are such that its width is substantially equal to, or only slightly less than the diameter of the aperture in which it is inserted, while the thickness of the shank is, in the present instance, less than the aperture diameter.

The locking barbs are formed from the edges of the locking shank by coining or swaging or the like, and have multiple bevelled faces forming locking surfaces. As the locking shank passes through a corresponding aperture, the locking surfaces initially compress the softer but only very slightly resilient material of the board and then the barb scores the material.

The slight resilience of the compressed board material then causes it to flow back behind the barbs in the area of the scoring and lock the pin in place in the board.

In a first form of the present invention, single barbs are provided in each oppositely disposed edge of the pin locking shank, while in a second form of the invention, a pair of barbs are formed in tandem relationship on each oppositely disposed edge. In the latter case, a secondary locking effect is provided to enhance the stability of the pin in the terminal board.

Yet a third form of the present invention employs two side-by-side sets of barbs disposed in tandem on the oppositely disposed edges of the locking shank. With each barb, of course, the double bevelled locking surfaces are effective to compress the material and then the barbs score the material of the terminal board, the slight resilience of the compressed material causes it to flow back behind the barbs in the area of the scoring to lock the terminals in place.

The invention, both as to its organization and method of operation, taken with further objects and advantages thereof, will best be understood by reference to the following description taken in connection with the accompanying drawings, in which.

Figures 1, 2, 3, 4, 5:
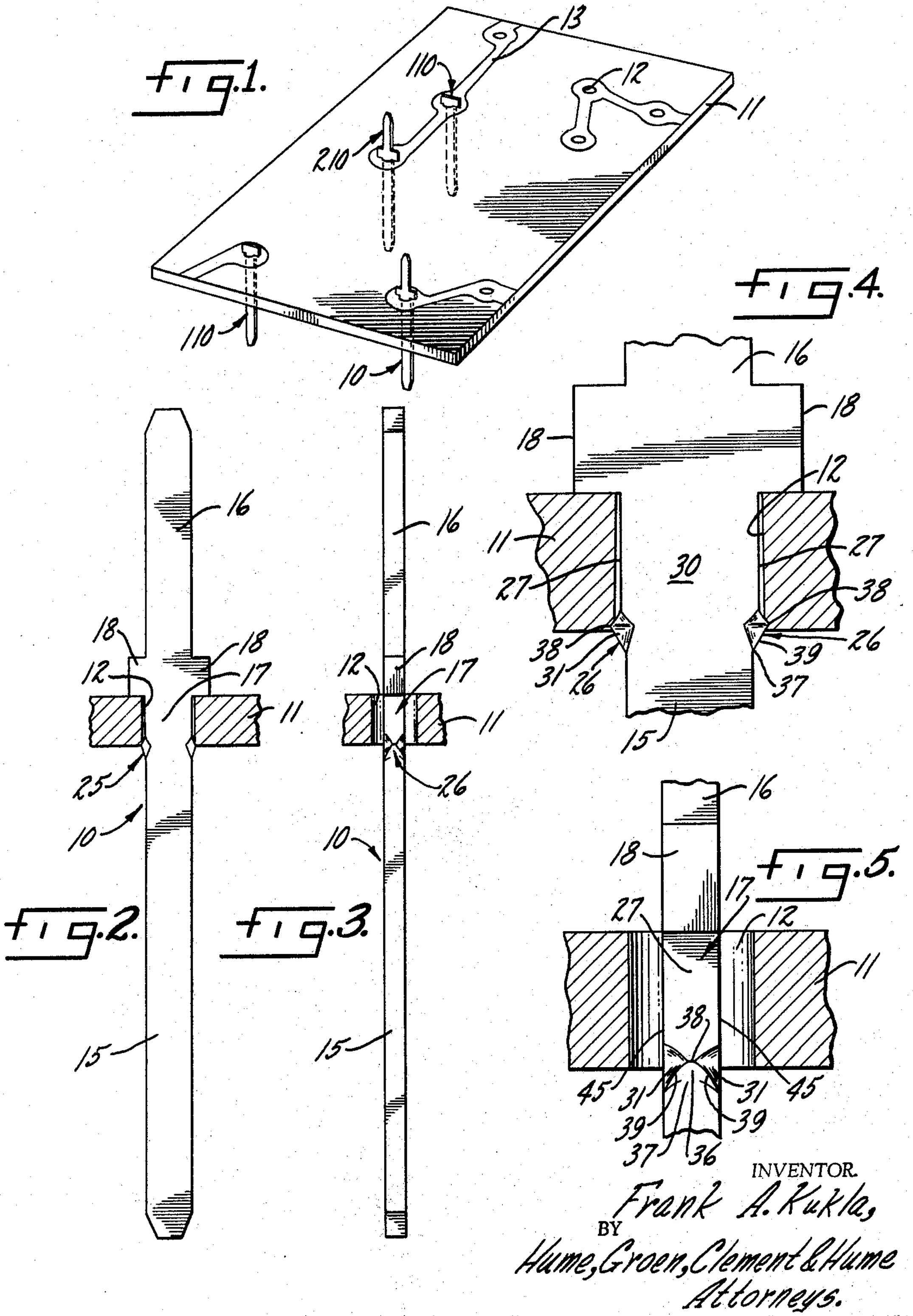
FIGURE 1 is a perspective view of a portion of a printed circuit board with several terminal pins embodying features of the present invention inserted in circular apertures formed in the board.
FIGURE 2 is an enlarged front elevational view of a first form of the terminal pin embodying features of the present invention, with the pins inserted in a terminal board.
FIGURE 3 is a side-elevational view of the pin illustrated in FIGURE 2.
FIGURE 4 is a further enlarged front-elevational view of the locking arrangement on the terminal pin illustrated in FIGURES 2 and 3.
FIGURE 5 is a side elevational view of the locking arrangement illustrated in FIGURE 4.

Referring now to the drawings, and particularly to FIGURE 1, a plurality of terminal pins, 10, 110, and 210, embodying features of three forms of the present invention, are shown inserted in a printed circuit board 11. The pins 10, 110, and 210 are, according to the present invention, solidly seated and securely locked against axial, lateral, and rotational displacement in corresponding circular apertures 12 extending through the circuit board 11 and appropriately associated with circuitry 13 conventionally formed on the board.

The terminal pins 10, 110, and 210, are formed of a conducting metal such as brass or the like. The printed circuit board 11 is formed of an insulating material such as a phenolic or other non-metallic material. The material forming the printed circuit board 11 is softer than the metallic pins 10, 110, and 210. In the case of phenolics and like materials generally used in the fabrication of printed circuit boards or the like, the material is very slightly resilient. As will hereinafter be discussed in detail, this characteristic is a factor in the present invention.

According to the present invention, each of the three forms of terminal pins 10, 110, and 210, cooperate with the material of the printed circuit board 11 when inserted in an aperture 12 to solidly mount and securely lock the pins in axial, lateral, and rotational fixed relationship on the printed circuit board. The three forms of the present invention differ in the extent of their locking effects. To broadly characterize their distinguishing features, it is only necessary to discuss the extent of the locking effect provided, for example.

The first form of terminal pin 10 utilizes a single locking effect while the second form of terminal pin 110 employs a tandem locking effect. The third form of terminal pin 210 embodying features of the present invention provides, on the other hand, even a greater locking effect, which might be characterized as double tanden or multiple. The similar and distinguishing features of the three forms of the present invention will be better understood after a discussion of the use and operation of the invention, however.

Referring now to FIGURES 2–5, a terminal pin 1 embodying features of a first form of the present invention is illustrated. The pin 10 is, a feed through type terminal having a relatively long wire wrap shank 15 on one end and a somewhat shorter wire wrap shank 16 on its opposite end. Intermediate the wire wrap shanks 15 and 16, a slightly wider locking shank 17 is defined below the positioning shoulders 18 extending transversely of the locking shank. As seen by contrasting FIGURES 2 and 3, for example, the pin 10 is generally rectangular in cross sectional configuration and is substantially twice as wide as it is thick.

To solidly mount and securely lock the terminal pin 10 against axial, lateral, and rotational displacement in the aperture 12, a locking arrangement 25 embodying features of the present invention is formed on the locking shank 17 at its juncture with the wire wrap shank 15. In the first form of the present invention embodied in the terminal pin 10, the locking arrangement 25 comprises an identical pair of locking barbs 26 formed on the oppositely disposed edges 27 defining the thickness of the locking shank 17. The barbs 26 are best illustrated in enlarged FIGURES 4 and 5.

As has been pointed out, each of the barbs 26 is identical in construction and is formed by coining or swaging or the like. In effect, the opposite faces 30 of the locking shank 17 are differentially coined or swaged toward each other, as at 31, in such a manner as to cause the metal of the locking shank to flow inwardly in bevelled relationship. The effect is to provide an outwardly bevelled surface 36, hereinafter referred to as a compression surface, which is relatively wide at its base 37 and narrows down to a tip 38. Oppositely disposed converging edges 39 define the sides of the compression surface 36, which has a somewhat semi-conical configuration as a result of the forming operation. Depressions, identified at 31, thus extend rearwardly of the converging edges 39 into the opposite faces 30 of the locking shank 17.

Keeping in mind that the width or distance between the edges 27 of the locking shank 17 is substantially equal to the diameter of the circular aperture 12, it will be seen that the compression surfaces 36 on the barbs 26 define a locking shank width which is progressively greater than the diameter of the aperture as one progresses from the bases 37 of the surfaces 36 toward the tips 38 thereof. At the same time, the surfaces 36 become progressively narrower.

Turning to the actual insertion of a terminal pin in a corresponding aperture 12 in the terminal board 11, it should first be pointed out that the corners 45 of the locking shank 17 extend out far enough to cause them to score slightly through the phenolic material when the shank 17 passes through the aperture 12. This is due to the fact that the diameter of the aperture 12 is substantially equal to the actual width of the locking shank 17, rather than to its maximum dimension which is across the diagonal between opposite corners 45. The stabilizing effect of this slight interference relationship is beneficial, of course, though it forms no specific part of the present invention.

As the oppositely disposed barbs 26 on the shank 17 enter the aperture 12, the outwardly inclined or bevelled compression surfaces 36 force phenolic material outwardly, compressing it. In effect, the phenolic material at any one point in the aperture 12 continues to be compressed outwardly as a barb 26 moves past it, until the corresponding edge 39 of the barb 26 moves on past the material at this point. Since the material is only very slightly resilient, this compressed portion of it snaps back only minutely behind the barb 26.

The material which is longitudinally aligned with the tip 38 is compressed to a greater extent, as would be expected. As the tip 38 passes the material at any one point, however, it scores the material because it is narrower at this point and the material is greatly compacted here. Where it is scored, the compaction of the material is disturbed and it tends to flow inwardly in the area of the score, thus expanding inwardly behind the barb 26.

The foregoing phenomena occurs until the shoulders 18 strike the upper surface of the board 11. The pin 10 is thus securely locked in the board by expansion of the phenolic material taking place between the barbs 26 and the locking shoulders 18. The barbs 26 have almost passed through the aperture 12 at this point.

The terminal pin 10 is thus not only mounted, it is also securely locked against axial, lateral, and rotational displacement in a corresponding aperture 12, as has been pointed out. The expansion of phenolic material behind the barbs 26 in the area of the score prevents axial displacement or pullout of the pin. The combination of the expanded phenolic material behind the barbs 26 and the lateral stabilizing effect of the barbs working against the shoulders 18 prevents lateral displacement. Furthermore, the barbs 26 extending radially of the shank 17 into the phenolic material of the board 11 prevents rotational displacement of the pin.

Figures 6, 7, 8, 9, 10:
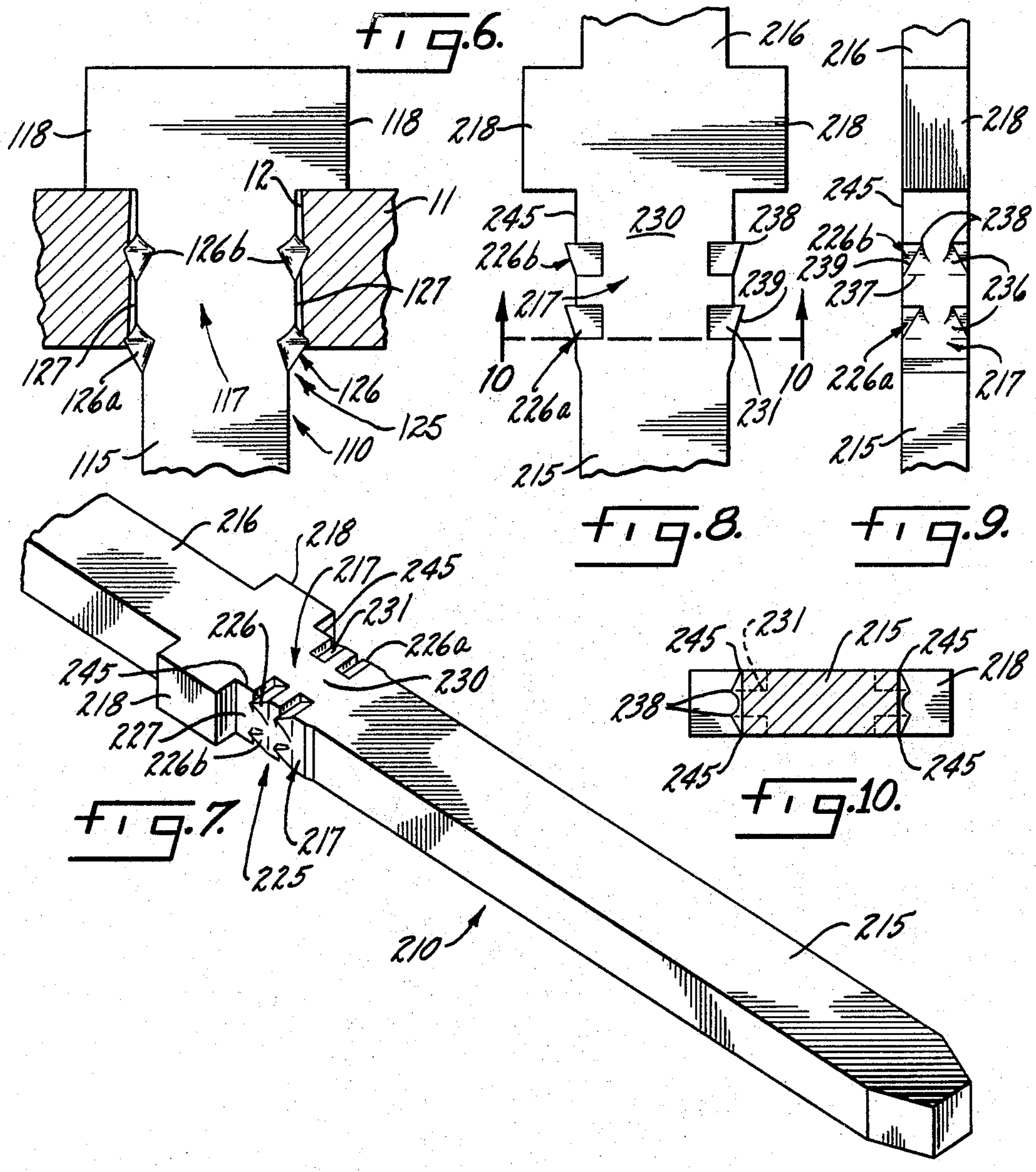
FIGURE 6 is an enlarged front elevational view of the locking arrangement on a second form of terminal pin embodying features of the present invention.
FIGURE 7 is a perspective view of yet a third form of terminal pin embodying features of the present invention.
FIGURE 8 is an enlarged front elevational view of the locking arrangement on the terminal pin illustrated in FIGURE 7.
FIGURE 9 is a side elevational view of the terminal pin locking arrangement illustrated in FIGURE 8.
FIGURE 10 is a sectional view taken along line 10—10 of FIGURE 8.

Turning to FIGURE 6, the aforementioned terminal pin 110 embodying features of the second form of the present invention is illustrated as inserted in a circular aperture 12 in a terminal board 11. The terminal pin 110 is, in general, similar to the terminal pin 10 hereinbefore discussed, with the exception that it is not a feed through type terminal. In other words, it comprises only a single wire wrap shank 115 having a locking shank 117 and positioning shoulders 118 formed at its upper end. To solidly mount and securely lock the terminal pin 110 against axial, lateral, and rotational displacement in the aperture 12, a locking arrangement 125 embodying features of the present invention is formed on the locking shank 117.

The locking arrangement 125 is comprised of two locking barbs 126 formed in tandem relationship on each of the oppositely disposed edges 127 defining the thickness of the locking shank 117. Each of the barbs 126 is precisely identical in construction and configuration to the locking barbs 26 hereinbefore discussed in relation to the terminal pin 10 embodying the first form of the present invention. The lower oppositely disposed barbs 126*a* are positioned at the juncture of locking shank 117 and wire wrap shank 115 in the manner of the barbs 26 hereinbefore discussed, while the barbs **126*b* are positioned intermediate the barbs 126*a* and the positioning shoulders 118**.

As the oppositely disposed lower barbs **126*a* on the shank 117 enter the aperture 12, and pass therethrough, they perform in identical fashion to the barbs 26 hereinbefore discussed in relation to the terminal pin 10. The phenolic material of the board 11 is first compressed and then scored by the barbs 126*a*. The slight resiliency of the compressed phenolic material causes it to flow back behind the barbs 126*a*** in the area of the score as they progress through the material.

With the terminal pin 110 embodying the second form of the present invention, however, once the lower barbs **126*a* have passed a substantial portion of the distance through the board 11, the upper set of barbs 126*b* enter the aperture 12. They provide a secondary locking effect by compressing the material of the board once more and, subsequently, scoring it. The material of the board, again through its slight natural resiliency, flows back behind the second set of bars 126*b* in the area of the score. At the same time, compression of the material of the board 11 ahead of the barbs 126*b* tends to enhance the locking effect of the lower set of barbs 126*a* by exerting greater pressure on the barbs 126*a* from behind, or captivating the material of the board 11 between barbs 126*a* and 126*b***.

Similarly to the pin 10 hereinbefore discussed, the pin 110 is not only solidly mounted at this point, but it is also securely locked against axial, lateral and rotational displacement, in the manner hereinbefore discussed. The pairs of locking barbs 126 arranged in tandem relationship provide a further increased locking effect, however.

A third form of terminal pin embodying features of the present invention is illustrated in FIGURES 7–10 at 210. The terminal pin 210 employs the same basic features of the present invention hereinbefore discussed in relation to the terminal pins 10 and 110, together with a further enhanced locking effect. The terminal pin 210 is a feed through type terminal similar in construction to the pin 10 hereinbefore discussed. It includes a relatively long wire wrap shank 215 on one end and a somewhat shorter wire wrap shank 216 on its opposite end. Intermediate the wire wrap shanks 215 and 216, a locking shank 217 is defined below the positioning shoulders 218 extending transversely of the locking shank. Once more, the terminal pin 210 is generally rectangular in cross sectional configuration and is substantially twice as wide as it is thick. The locking shank 217 is again slightly wider than the wire wrap shank 215.

To solidly mount and securely lock the terminal pin 210 against axial, lateral, and rotational displacement in the aperture 12, a locking arrangement 225 embodying features of the third form of the present invention is formed on the locking shank 217. In the terminal pin 210, the locking arrangement 225 is embodied in two side-by-side sets of locking barbs 226 formed in tandem relationship on the oppositely disposed edges 227 defining the thickness of the locking shank 217.

There are, in effect, four barbs 226 on each edge 227 of the locking shank 217; a lower side-by-side set of barbs **226*a*, and an upper side-by-side set of barbs 226*b*. Since the construction and arrangement of each set of barbs on the locking shank 217 is identical, only a single set of barbs 226** is described in detail, corresponding reference numerals being applied to the other sets of bars, of course.

Each set of barbs 226 is formed by differentially coining or swaging the material from the opposite faces 230 of the locking shank 217 inwardly toward each other, as at 231, in such a manner as to cause the metal of the locking shank to flow inwardly in bevelled relationship. Unlike the locking arrangements 26 and 126 hereinbefore discussed in relation to the terminal pins 10, and 110, however, the swaging or coining operation is not carried out to the extent that a single barb is formed. Rather, the swaging or coining is designed to force or form out somewhat smaller barbs 226 adjacent the oppositely disposed faces 230.

As a result, an outwardly bevelled compression surface 236 is formed on each of the barbs 226. Each surface 236 is relatively wide at its somewhat upwardly inclined base 237 and narrows down to a tip 238. The sides of each surface 236 are defined by converging edges 239 and, once more, the surface is slightly conical as a result of the forming operation. It will be noticed that the innermost opposed edges 239 are slightly shorter than the outer edges 239, since they are formed solely by material being coined out of the face 230 of the locking shank 127.

Once again, keeping in mind that the width or distance between the edges 227 of the locking shank 217 is substantially equal to the diameter of the circular aperture 12, it will be seen that the compression surfaces 236 of the barbs 226 define a progressively greater width than the diameter of the aperture as one progresses from the bases 237 toward the tips 238 of the barbs. At the same time, the compression surfaces 236 become progressively narrower, of course.

As a terminal pin 210 is inserted into a corresponding aperture 12, it will be seen that the corners 245 of the locking shank 217, which extend out far enough to score slightly through the phenolic material, do so before the lowermost sets **226*a* of barbs 226 are reached. Again, this slight interference fit enhances the stability of the terminal 210 to an extent but forms no specific part of the present invention. When the lowermost set 226*a* of barbs 226 on each edge 227 of the locking shank 217 engages the material of the board 11, each barb 226 performs in substantially the same fashion as the bars 26 and 126 hereinbefore discussed in relation to the first and second forms of the present invention embodied in terminal pins 10 and 110**.

In other words, as each of the side-by-side sets **226*a* of barbs 226 enter the aperture 12, their outwardly inclined or bevelled surfaces 236 force phenolic material outwardly, compressing it. In effect, the phenolic material at any one point in the aperture 12 continues to be compressed outwardly as a barb 226 moves past it until the corresponding edge 239 of the barb moves on past the material at this point. Since the phenolic material is only very slightly resilient, this compressed portion of it flows back only minutely behind the barb 236**.

The material which is longitudinally aligned with a barb tip 238 is compressed to a greater extent, as would be expected. As the tip 238 passes, however, it scores the material because it is narrow at this point and the material is so compressed. Where it is scored, the compaction of the material is disturbed and it tends to flow inwardly in the scored area, thus flowing behind the corresponding barb 226.

The foregoing phenomena occurs until the shoulders 218 strike the upper surface of the board, 11, of course. Similarly to the terminal pin 110, once the lower sets **226*a* of barbs 226 have passed a substantial distance through the board 11, the upper sets 226*b* of barbs 226 enter the aperture 12. They provide a secondary locking effect by compressing the phenolic material once more and also scoring it again at the tips 238 associated with the upper sets 226*b* of barbs 226. The material of the board flows back behind the barbs 226 in the area of the score. At the same time compression of the material of the board 11 in the area of the score ahead of the barbs 226 in the sets 226*b* tends to enhance the locking effect of the lower sets 226*a* of barbs 226 in the lower set from behind or, captivating the material of the board 11** between the barbs of the upper and lower sets.

It will be seen that the locking arrangement 225 associated with the terminal pin 210 provides locking forces positioning the pin against axial, lateral, and rotational displacement in the aperture 12. Each barb 226 in a lower set **226*a* of barbs on each edge 227** of the locking shank 217 is longitudinally aligned with a barb 226 in the upper set 226*b* of the barbs in the manner of the longitudinally aligned with a barb 226 in the upper set 226*b* of the barbs in the manner of the longitudinally aligned barbs 126 on the pin 110. Accordingly, four individually aligned pairs of locking barbs 226 are provided around the axis of the locking shank 217.

The barbs 226 are slightly smaller in size than the barbs 26 and 126, of course, but their configuration is substantially identical. The overall locking effect of the eight relatively smaller barbs 226 on the terminal pin 210 provides an extremely effective locking arrangement.

Regardless, however, the locking arrangement associated with each form of the invention, as embodied in the terminal pins 10, 110, and 210, are simply and expeditiously formed. Inexpensive swaging or coining operations are sufficient in each instance to suitably form the barbs in the manner discussed.

The terminals have exceptional mechanical characteristics which are highly desirable for commercial acceptance. This invention provides, for the first time, an electrical terminal that can be economically made from flat sheet metal and which embodies, in itself, a self-locking feature. It is an electrical terminal that is eminently suitable for use with any type of non-metallic material which is substantially rigid. A terminal that requires no staking, riveting, or soldering or the like to securely affix it to a mounting member.

It is the physical characteristics of this rigid, non-metallic material, exemplified by a phenolic or the like, upon which this invention relies, as will be recognized. A phenolic, for example, is generically defined in the plastics industry as a dense, hard, brittle, material having a compression strength of approximately 20,000 p.s.i. or greater, and a relative hardness of approximately 100 or greater on the Rockwell M scale.

While several embodiments described herein are at present considered to be preferred, it is understood that various modifications and improvements may be made therein, and it is intended to cover in the appended claims all such modifications and improvements as fall within the true spirit and scope of the invention.

What is desired to be claimed and secured by Letters Patent of the United States is:

1. A terminal and board assembly, comprising: a board formed of a relatively rigid, dense, brittle material having only a slight amount of resiliency, an aperture formed through said board, and a terminal extending through said aperture, said terminal including a locking shank disposed in said aperture, said locking shank having oppositely disposed sides and edges, and locking barb means formed on each of said edges by forcing material from the locking shank inwardly of the sides of the shank and causing material to protrude outwardly of said edges, said locking barb means including compression surface means inclined outwardly from a corresponding edge, each of said compression surface means being relatively wide adjacent to said corresponding edge and narrowing to tip means, and a depression in each side of said shank alongside a corresponding compression surface means where said material has been forced inwardly to form said barb means, the material of said board in said aperture being compressed outwardly by said compression surface means and scored by said tip means, the compressed material flowing back to a certain extent behind said barb means to lock said terminal in said board.

2. The assembly of claim 1 further characterized in that said board material flows back behind said barb means substantially only in the area where it is scored by said tip means.

3. The assembly of claim 2 further characterized in that each of said compression surface means is generally segmentally conical in cross-section.

4. The assembly of claim 1 further characterized in that each of said locking barb means comprises at least a pair of locking barbs set in side-by-side relationship on a corresponding edge.

5. The assembly of claim 4 further characterized in that two pair of said barbs are arranged in tandem relationship on each of said edges.

6. A terminal and board assembly, comprising: a board formed of relatively rigid phenolic material having only a slight amount of resiliency, an aperture formed through said board, and a terminal extending through said aperture, said terminal including a locking shank fabricated of a metal harder than said phenolic material and disposed in said aperture, said locking shank being substantially rectangular in cross-section having oppositely disposed sides and edges, and locking barb means formed on each of said edges by forcing material from the locking shank inwardly of the sides of the shank and causing material to protrude outwardly of said edges, said barb means including compression surface means inclined outwardly from a corresponding edge, each of said compression surface means being relatively wide adjacent to said corresponding edge and narrowing to tip means, and a depression in each side of said shank alongside a corresponding compression surface means where said material has been forced inwardly to form said barb means, the phenolic material of said board in said aperture being compressed outwardly by said compression surface means and scored by said tip means, the compressed material where it is scored by said tip means flowing back behind said barb means to lock said terminal in said board.

7. A terminal for insertion in an aperture in a terminal board such as a printed circuit board or the like fabricated of a relatively hard material such as a phenolic resin, comprising: a locking shank for passing through said aperture, said locking shank being substantially rectangular in cross-section and having oppositely disposed sides and edges, and locking barb means formed on each of said edges by forcing material from the locking shank inwardly of the sides of the shank and causing material to protrude outwardly of said edges, said barb means including compression surface means inclined outwardly from a corresponding edge, each of said compression surface means being relatively wide adjacent to said corresponding edge and narrowing to tip means, and a depression in each side of said shank alongside a corresponding compression surface means where said material has been forced inwardly to form said barb means, said compression surface means adapted to compress said phenolic material when said shank is inserted in said aperture, said tip means adapted to score said compressed phenolic material whereby the phenolic material flows back to a certain extent behind said barb means to lock said terminal in the board.

8. The terminal of claim 7 further characterized in that each of said compression surface means is generally segmentally conical in cross-section.

9. The terminal of claim 8 further characterized in that said locking barb means includes a pair of locking barbs arranged in side-by-side relationship on each of said edges.

10. The terminal of claim 9 further characterized in that two pair of side-by-side barbs are arranged in tandem relationship on each of said edges.

References Cited

UNITED STATES PATENTS

| | | | |
|---|---|---|---|
| 2,928,066 | 3/1960 | Gordon | 339—198 |
| 3,010,353 | 11/1961 | Psaros | 85—21 |

MARVIN A. CHAMPION, *Primary Examiner.*

PATRICK A. CLIFFORD, EDWARD C. ALLEN, *Examiners.*

J. H. McGLYNN, *Assistant Examiner.*